United States Patent [19]

Liao et al.

[11] Patent Number: 5,499,026
[45] Date of Patent: Mar. 12, 1996

[54] CONDUCTIVE TOUCH PAD WITH CAPACITIVE BLOCKING FILTER

[75] Inventors: York Liao; Michael Y. S. Chan, both of Kowloon, Hong Kong

[73] Assignee: Varitronix Limited, Kowloon, Hong Kong

[21] Appl. No.: 316,070

[22] Filed: Sep. 30, 1994

Related U.S. Application Data

[63] Continuation of Ser. No. 910,086, filed as PCT/GB91/00032, Jan. 10, 1991, abandoned.

[30] Foreign Application Priority Data

Jan. 11, 1990 [GB] United Kingdom .................. 9000624
Sep. 24, 1990 [GB] United Kingdom .................. 9020766

[51] Int. Cl.$^6$ ........................................... G06F 3/14
[52] U.S. Cl. ........................................ 341/33; 341/26
[58] Field of Search ...................... 341/33, 26; 331/65, 331/67; 361/181, 212; 345/173, 174

[56] References Cited

U.S. PATENT DOCUMENTS 4,441,034  4/1984  Iten ........................................ 307/117
4,924,222  5/1990  Antikidis et al. ......................... 341/33
4,954,823  9/1990  Binstead ................................... 341/33
5,012,124  4/1991  Hollaway ................................. 341/33

FOREIGN PATENT DOCUMENTS 0080613  6/1983  European Pat. Off. .
2727522  1/1979  Germany .
8503820  8/1985  WIPO .

*Primary Examiner*—John K. Peng
*Assistant Examiner*—Andrew Hill
*Attorney, Agent, or Firm*—Kane, Dalsimer, Sullivan, Kurucz, Levy, Eisele & Richard

[57] ABSTRACT

A touch sensitive pad consists of a number of electrical conductive pads (10) surrounded by a conductive pad (11). Each pad (10) is connected via a respective capacitive blocking filter to a multiplexer (13) and an oscillator (14). When the touch pad is touched directly to effectively bridge between one of the pads (10) and the surrounding pad (11), a change in effective impedance is detected by a resultant variation in the frequency of the oscillator (14).

6 Claims, 1 Drawing Sheet

CONDUCTIVE TOUCH PAD WITH CAPACITIVE BLOCKING FILTER

This is a continuation of application Ser. No. 07/910,086 filed as PCT/GB91/00032, on Jan. 10, 1991, abandoned.

BACKGROUND OF THE INVENTION

1. Field of the Invention

The invention relates to touch sensing devices.

2. Description of the Related Art

Touch sensing devices are known in which a single switching arrangement or a multiple selective position sensing arrangement is achieved by touching the device itself or a chosen part of the device respectively. Such devices may make use of membrane switches, optical sensing or electrical capacitive changes. Currently, capacitive touch sensing devices are provided with electrically insulating membranes or resin coatings on their operative or exposed surfaces and generally have the drawbacks of poor reliability and poor sensitivity.

It is an object of the invention to provide a touch sensing device in which such drawbacks are at least reduced.

SUMMARY OF THE INVENTION

According to the invention a touch sensing device comprises an electrically conductive touch pad supported on a insulating substrate, and detecting means electrically connected to the touch pad via a capacitive blocking filter to prevent static electrical charges being applied to the detecting means, wherein the detecting means detects a change in the impedance at the touch pad caused by a user directly touching the touch pad, in which the detecting means includes an oscillator whose output frequency varies with the change in input impedance.

The capacitive touch sensing device may include two or more touch pads each with a respective capacitive blocking filter, and a multiplexer to sequentially connect each capacitor, and hence each touch pad, to the detecting means.

The touch pads may each be arranged adjacent a grounded pad such that in use the touch pad can be effectively and selectively bridged to ground when the touch pad is touched by the user.

The touch pads may be arranged adjacently in electrically parallel pairs.

BRIEF DESCRIPTION OF THE DRAWINGS

A touch sensing device according to the invention will now be described by way of example only with reference to the accompanying drawing in which.

DESCRIPTION OF THE PREFERRED EMBODIMENTS

Figure 1:
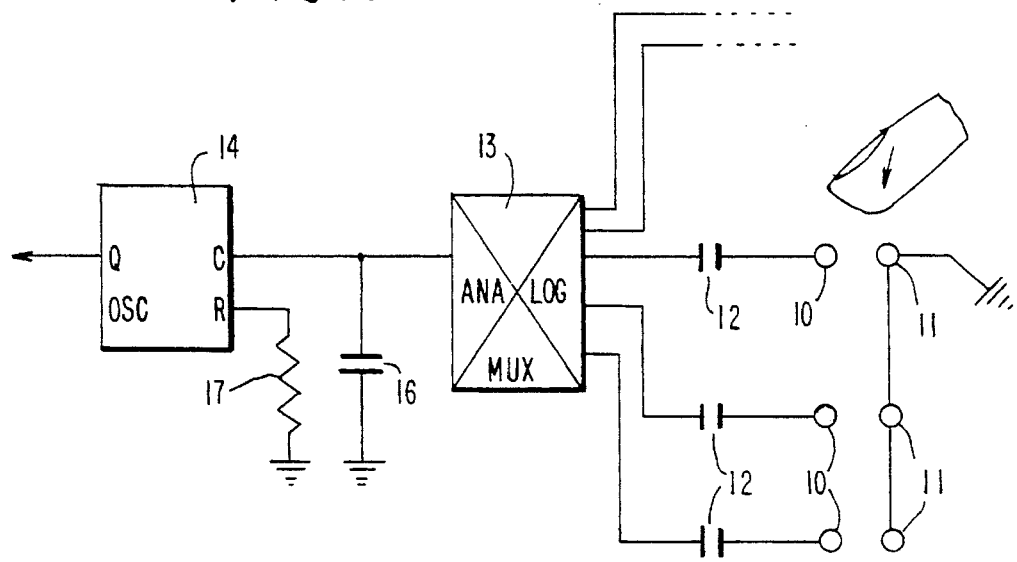
FIG. 1 is a schematic circuit diagram of the device.
Figure 2:
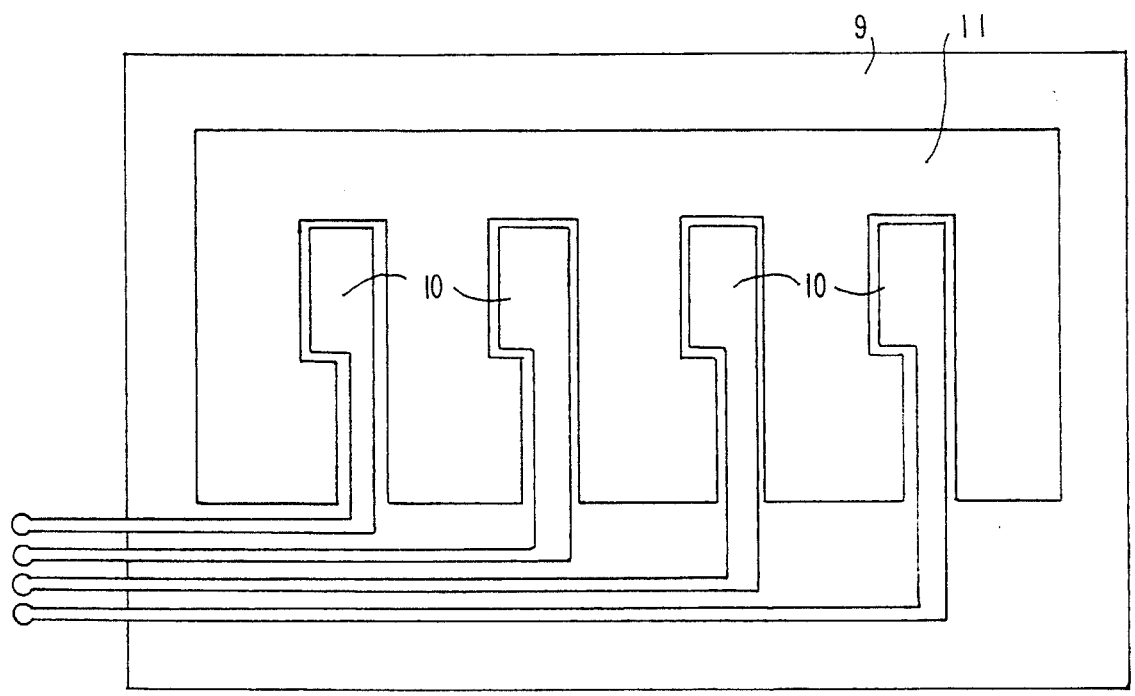
FIG. 2 shows a top view of part of a touch sensing pad.

Referring to the drawing a touch sensitive pad consists of a number of electrically conductive pads 10 and a surrounding conductive pad 11 supported by an insulating substrate 9. Each pad 10 is electrically connected via a respective blocking capacitor 12 to an analogue multiplexer 13. The surrounding pad 11 is connected to ground. The output of the multiplexer 13 is connected to an oscillator 14. Where it is required to be able to adjust to quiescent frequency of the oscillator 14, a resistor 17, which may be adjustable, and/or a capacitor 16, which may also be adjustable, are connected to the RC ports of the oscillator 14.

In use, whenever a human finger, for example, is touched against the substrate and effectively bridges a gap between a conductor pad 10 and the surrounding conductor pad 11, the net effective impedance applied to the capacitive input port changes and the oscillator 14 responds to vary its output frequency from its quiescent frequency. This variation of frequency represents that the pad has been touched and by simultaneously sensing the sequencing of the multiplexer 13, which of the conductive pads 10 that has been touched by the finger is also determined.

In this way, whenever the pad is touched, that touching and the position of the finger is determined. The body provides an impedance between the pads 10 and 11 which is effective to change the effective input impedance to the oscillator 14. The detector oscillator 14 responds to such changes in impedance in its input circuit.

In an alternative embodiment, a touch pad is formed with one or more exposed conductive pads 10 as above except that the surrounding pad 11 is omitted. Each pad 10 is connected via a respective capacitor to the oscillator. The multiplexer 13 is provided where required. When a finger or other part of the body is touched against the pad or any of the pads, the effective impedance applied to the input of the oscillator alters and so induces a variation of its output frequency as before.

The blocking filters 12 prevent static electricity charges being applied to the input of the oscillator. Such charges may be considerable in use and would otherwise destroy the integrated circuit components of the oscillator 14. The capacitors 12 have a preferred value of 100 to 1000 $p^F$. The oscillator frequency is preferably about 100 $KH_z$. A suitable oscillator is a multivibrator Model CD 4047 supplied by Record Company of America (RCA).

The filters 12 also filter out direct current components and some electrical noise from a finger applied to the touch pad.

It will be noted that the touch sensitive pads described have exposed conductive pads which are touched directly in use; this contrasts to the prior art capacitive touch pads. The described pads are simpler to manufacture and have been found to lead to generally more reliable and sensitive operation.

In a particularly preferred application, the touch sensing device is used with a display such as a CRT display or, more preferably, a liquid crystal display. The conductive pads are transparent and may be formed, for example, from a deposit of tin oxide laid on the front surface of the display.

In the described embodiments, the device responds in practice to the changes brought about by directly touching the pads which normally result from one or more of the following:

1. Changes in effective input capacitance;

2. Changes in effective input resistance; and

3. Application of A.C. signals, primarily mains frequency (50 or 60 c/s) pick-up signals from local power lines.

We claim:

1. A touch sensing device comprising a conductive touch pad supported on an insulating substrate, and detecting means electrically connected to the touch pad via a capacitive blocking filter to prevent static electrical charges being applied to the detecting means by a user, wherein the detecting means detects a change in the impedance at the touch pad caused by the user directly touching the touch pad to connect the touch pad to ground, in which the detecting means includes an oscillator whose output frequency varies with the change in input impedance whenever the touch pad is connected to ground through the touch of the user.

2. A touch sensing device according to claim 1, which includes two or more touch pads each with a respective capacitive blocking filter, and a multiplexer between each capacitive filter and the detecting means to sequentially connect each capacitor to the detecting means.

3. A touch sensing device according to claim 1, in which the touch pad is arranged adjacent a grounded pad such that in use the touch pad can be effectively and selectively bridged directly to the grounded pad through the touch of the user.

4. A touch sensing device comprising a conductive touch pad supported on an insulating substrate, a grounded pad mounted closely adjacent the touch pad, and detecting means electrically connected to the touch pad via a capacitive blocking filter to prevent static electrical charges being applied to the detecting means by a user, wherein the detecting means detects a change in the impedance at the touch pad caused by the user bridging the touch pad to the grounded pad to connect the touch pad to ground, in which the detecting means includes an oscillator whose output frequency varies with the change in input impedance whenever the touch paid is connected to ground through the bridging touch of the user.

5. A touch sensing device according to claim 4, which includes two or more touch pads each with a respective capacitive blocking filter, and a multiplexer between each blocking filter and the detecting means to sequentially connect each touch pad to the detecting means.

6. A touch sensing device comprising a conductive touch pad supported on an insulating substrate, and detecting means electrically connected to the touch pad via a capacitive blocking filter to prevent static electrical charges being applied to the detecting means by a user, wherein the detecting means detects a change in the resistance at the touch pad caused by the user directly touching the touch pad to connect the touch pad to ground, in which the detecting means includes an oscillator whose output frequency varies with the change in input resistance whenever the touch pad is connected to ground through the touch of the user.

* * * * *